United States Patent [19]
Futsuhara et al.

[11] Patent Number: 5,768,077
[45] Date of Patent: Jun. 16, 1998

[54] EARTHING WIRE DISCONNECTION DETECTION APPARATUS AND LEAKAGE DETECTION APPARATUS HAVING AN EARTHING WIRE DISCONNECTION DETECTION FUNCTION CONDUCTOR

[75] Inventors: Koichi Futsuhara; Norihiro Asada, both of Urawa, Japan

[73] Assignee: The Nippon Signal Co., Ltd., Tokyo, Japan

[21] Appl. No.: 809,228

[22] PCT Filed: Jun. 27, 1996

[86] PCT No.: PCT/JP96/01787

§ 371 Date: Mar. 18, 1997

§ 102(e) Date: Mar. 18, 1997

[87] PCT Pub. No.: WO97/04323

PCT Pub. Date: Feb. 6, 1997

[30] Foreign Application Priority Data

Jul. 19, 1995 [JP] Japan .................... 7-182781

[51] Int. Cl.[6] .................................... H02H 3/00
[52] U.S. Cl. .................................... 361/42; 361/78
[58] Field of Search ................. 361/42, 44, 45, 361/49, 88, 78; 324/509, 772; 340/649, 652

[56] References Cited

U.S. PATENT DOCUMENTS 4,661,880  4/1987  Futsuhara .
4,757,417  7/1988  Futsuhara .
5,027,114  6/1991  Kawashima et al. .

FOREIGN PATENT DOCUMENTS 51-31933      9/1976   Japan .
5-28348      12/1986   Japan .
61-288170    12/1986   Japan .
5-225891      9/1993   Japan .
7-83976       3/1995   Japan .
WO 94/23303  10/1994   WIPO .
WO 94/23307  10/1994   WIPO .
WO 94/23496  10/1994   WIPO .

Primary Examiner—Jeffrey A. Gaffin
Assistant Examiner—Sally C. Medley
Attorney, Agent, or Firm—Finnegan, Henderson, Farabow, Garrett & Dunner, L.L.P.

[57] ABSTRACT

A leakage and earthing wire disconnection detection apparatus monitors for earthing wire disconnection and leakage of an electrical or electronic device during operation of the device. Two earthing wires are independently provided for the electrical or electronic device. The ends of the earthing wires on the electrical or electronic device side are electrically connected together, while earth-side ends are connected independently to earth. A single closed loop is made up of the two earthing wires, the electrical or electronic device, and earth. A detection circuit determines that the earthing wires are normal when the closed loop is closed, and abnormal when the closed loop is open. In addition, the apparatus performs leakage detection of a motor, or the like, based on a current level flowing in the earthing wires.

18 Claims, 10 Drawing Sheets

EARTHING WIRE DISCONNECTION DETECTION APPARATUS AND LEAKAGE DETECTION APPARATUS HAVING AN EARTHING WIRE DISCONNECTION DETECTION FUNCTION CONDUCTOR

TECHNICAL FIELD

A first aspect of the present invention relates to an earthing wire disconnection detection apparatus for detecting disconnection of an earthing wire between an electrical or electronic device and earth, and in particular to an earthing wire disconnection detection apparatus which can detect earthing wire disconnection even during operation of the electrical or electronic device. A second aspect of the present invention relates to a leakage detection apparatus for detecting leakage of an electrical or electronic device, and in particular to a leakage detection apparatus which can continuously monitor for the presence of a disconnection of an earthing wire and for leakage, even during operation of the electrical or electronic device, by using an earthing wire disconnection detection apparatus.

BACKGROUND ART

With electrical or electronic devices, there are cases in which circuit operation requires the device to be earthed, and cases where although circuit operation does not require them to be earthed, in order to prevent danger such as electrocution due to leakage, they must be earthed. With this type of electrical or electronic device, if the earthing wire is disconnected, then the intended circuit operation cannot be obtained, or there is the possibility of electrocution or the like due to leakage.

Heretofore, as an apparatus for monitoring the earthing condition of an earthing wire, there is the apparatus disclosed for example in Japanese Unexamined Patent Publication No. 7-83976.

With this apparatus, prior to starting a load machine, the electric power circuit for the machine is forcibly grounded to an earth terminal, and a detection device is used to detect if the circuit is properly earthed.

With this apparatus however, the earth condition of the earthing wire is only checked prior to starting the machine, and monitoring of the earthing wire during operation of the machine is not carried out. Therefore, if the earthing wire becomes disconnected during operation of the machine, then of normal circuit operation being lost, machine use will continue without this being known, thus inviting an unexpected result.

For example, taking a known line filter circuit as an example, this has a normal mode noise absorbing capacitor connected between two lines, a common mode choke coil connected into the lines at a subsequent stage, and two common mode noise absorbing capacitors connected at a further subsequent stage between the lines and an earth terminal. The common mode noise absorbing capacitors are two terminal capacitors with a series connection point (central point) connected to earth.

With the above-mentioned line filter circuit, if a disconnection occurs in the earthing wire connecting the central point of the common mode noise absorbing capacitors, then the normal noise filtering function is lost. Since with the conventional apparatus, this disconnection fault the earthing wire cannot be detected, then in despite the earthing wire being disconnected, it is treated as if the normal filtering function is being obtained. Therefore, noise is propagated to the load, or the power source or signal supply side, connected to the line filter.

Moreover, with the circuit configuration of the above-mentioned earthing condition monitoring apparatus, the earthing wire for the load machine is connected between a ground relay contact point and earth. Therefore, even if the earthing wire is disconnected, a small current flows in a photocoupler of a detection device, with the problem that the controller for the unit is judged to be in a normal earthed condition.

Furthermore, as a conventional apparatus for detecting leakage of an electrical or electronic device, there is a type which detects an imbalance current in a power supply line to the electrical or electronic device.

With this leakage detection apparatus, for example with a load machine such as a motor, leakage is detected by monitoring for imbalance of a current flowing in the two power supply lines connected to the motor coil in the housing case. More specifically, in a worst case scenario where the power supply line for supplying power to the motor coil in the housing case contacts the housing case thus producing leakage, then a current flows in the earthing wire for earthing the housing case, so that the current flowing in the two power supply lines becomes unbalanced. If this unbalanced current condition is detected, then leakage is judged and a power supply switch connected in series with the power supply line is switched off, thereby interrupting power supply to the load.

With the above-mentioned conventional leakage detection apparatus, however, in the case where the earthing wire earthing the housing case becomes broken or disconnected, then even if the power supply line contacts the housing case thus producing leakage, the current flowing in the two power supply lines will not become unbalanced. Hence the leakage detection apparatus will not operate.

Examined Japanese Publication No. 51-31933 discloses an apparatus for detecting leakage based on a voltage to earth for the housing case of a motor. This apparatus thus has an earthing wire disconnection detection function. However with this apparatus also, disconnection of the earthing wire is only checked prior to starting the motor, and disconnection of the earthing wire is not monitored during operation of the motor. Furthermore, the construction is such that leakage is detected from the voltage to earth condition of the motor, obtained via a single earthing wire terminal A (E3') connected to the motor case. Therefore, if during operation of the motor, this earthing wire becomes disconnected, then leakage cannot be detected.

Moreover currently, in the case where a fault occurs in the leakage detection apparatus itself, then the leakage detection apparatus ceases to operate so that even if a leakage occurs, this cannot be detected and the power supply circuit cannot be shut off. There is thus the problem that the power supply to the electrical or electronic device continues.

The present invention takes into consideration the above situation, with the object of providing an earthing wire disconnection detection apparatus which can detect disconnection of an earthing wire during operation of an electrical or electronic apparatus. Moreover, it is an object of the present invention to provide a leakage detection apparatus of high reliability and safety which can continuously monitor for disconnection of an earthing wire and for leakage, during operation of an electrical or electronic device, and if one or the other occurs, can interrupt power supplied to the electrical or electronic device to thereby stop the electrical or electronic device.

DISCLOSURE OF THE INVENTION

To meet the above object, the earthing wire disconnection detection apparatus according to a first aspect of the present invention is provided with two earthing wires for respectively connecting an electrical or electronic device to earth, respective one ends of the two earthing wires being electrically connected to each other at the electrical or electronic device side, and respective other ends being earthed independent of each other to earth, thereby making up a single closed loop of the two earthing wires, the electrical or electronic device, and the earth; and incorporates a detection device connected to the closed loop, which judges the earthing wires to be normal when the closed loop is closed, and which judges the earthing wires to be abnormal when the closed loop is not closed.

With such a construction, since the two earthing wires, the electrical or electronic device, and the earth are connected so as to make up a single closed loop, then in the case where the earthing wires between the electrical or electronic device and earth are normal, then the closed loop conducts so that the electrical or electronic device is earthed. In the case of an abnormality, such as a disconnection in an earthing wire between the electrical or electronic device and earth, the closed loop is no longer closed. The detection device thus judges normal when the closed loop is closed and abnormal when the closed loop is not closed. As a result, it is possible to detect if the earthing wires are normal and to also detect if an earthing wire is disconnected. Hence abnormal operation of the electrical or electronic device, or electrocution or the like due to leakage, can be prevented.

Furthermore, since the earthing wires are earthed independent of each other to the earth side, then also if the respective earth terminals on the earth side are disconnected from earth, the closed loop will not be closed. Therefore it is possible to also detect if the earth terminals on the earth side are disconnected from earth. Supposing however that the earth terminals on the earth side are made common so that a similar closed loop is constructed, then it is not possible to detect if an earth terminal on the earth side has disconnected from earth.

Therefore, with the before-mentioned detection device of the earthing wire disconnection detection apparatus according to the present invention, preferably this includes at least one transformer, a secondary winding of the transformer being connected in series to the closed loop and an earthing wire disconnection detection signal being supplied to a primary winding of the transformer, and the earthing wire disconnection detection signal is sampled as a change in inductance of the transformer.

With another preferred example, the transformer involves two transformers, with respective primary windings connected in series with each other. With one of the two transformers, a secondary winding is connected in series to the closed loop, while with the other of the two transformers, a judgment output indicating if the earthing condition is normal is produced from a secondary winding.

With yet another preferred example, the construction includes two transformers with one transformer having the earthing wire disconnection detection signal supplied to a primary winding, and a secondary winding connected in series to the closed loop, and the other transformer having a primary winding connected to the closed loop in series with the secondary winding of the one transformer, with a judgment output indicating if the earthing condition is normal being produced from a secondary winding.

Moreover, the construction may be such that the two earthing wires are connected together via earthing wiring inside the electrical or electronic device.

With such a construction, if a disconnection occurs in the earthing wiring inside the electrical or electronic device, then the closed loop will no longer be closed. Hence the disconnection of the earthing wiring inside the electrical or electronic device can be detected.

As a preferred basic example of an electrical or electronic device to which the earthing wire disconnection detection apparatus of claim 5 can be applied, a line filter circuit can be used.

With such a construction, in the case of a disconnection of the earthing wire between the line filter circuit and earth, or of the internal earthing circuit wiring, then this can be reliably detected. Hence abnormal operation of the circuit, or electrocution or the like due to leakage, can be prevented.

The line filter circuit may include at least two capacitors. In this case, the two capacitors are each formed as a four terminal capacitor, and with each of the four terminal capacitors the respective capacitor electrodes have two mutually independent terminals, with the two terminals connected to one of the capacitor electrodes, connected in series with a line so as to form a circuit with one of the terminals, the capacitor electrode and the other of the terminals in series, and with one of the two terminals connected to the other of the capacitor electrodes being connected to each other, and the other of the two terminals being connected separately to respective line filter circuit side ends of the two earthing wires.

The line filter circuit may include a choke coil inserted in series in the line at an earlier stage than the two capacitors, and a capacitor separate from the two capacitors, the separate capacitor being formed as a four terminal capacitor, and provided at an earlier stage than the choke coil, with two terminals connected to one of the capacitor electrodes connected between the line so as to form a circuit with one of the terminals, the capacitor electrode and the other of the terminals in series, and two terminals connected to the other of the capacitor electrodes connected between the other line so as to form a circuit with one of said terminals, said capacitor electrode and the other of said terminas in series.

The electrical or electronic device to which the earthing wire disconnection detection apparatus of the present invention is applied may have a transmission transformer connected before or after the line filter circuit, the transmission transformer having an inter-winding electrostatic shield with two mutually independent electrodes, the two electrodes of the inter-winding electrostatic shield being included in series in the closed loop.

Furthermore, with another preferred example, the voltage produced in the choke coil or in the transmission transformer is made the earthing wire disconnection detection signal.

With the leakage detection apparatus according to a second aspect of the present invention, the construction incorporates, a leakage judgment device for judging the presence of leakage in the electrical or electronic device, a power supply control device for generating a power supply permit signal only when a judgment output indicating no leakage is generated from the leakage judgment device and simultaneously a judgment output indicating earthing wires normal is generated from the earthing wire disconnection detection apparatus of claim 1, and a switch device which is switched on when a power supply permit signal is generated from the power supply control device, to thereby connect a power supply line for the electrical or electronic device to a power source.

With such a construction, when the power source is switched on, then if the earthing wires are normal, normal judgment outputs are input simultaneously to the power supply control device from the earthing wire disconnection detection apparatus and the leakage judgment device. The switch is then switched on by a power supply permit signal from the power supply control device, thus starting power supply to the electrical or electronic device. If after commencement of power supply to the electrical or electronic device, either a leakage fault or a disconnection fault in the earthing wire occurs, then the power supply permit signal from the power supply control device stops. Hence the switch device is switched off, immediately interrupting power supply to the electrical or electronic device.

Consequently, leakage or earthing wire disconnection can be detected during operation of the electrical or electronic device. Furthermore, when leakage or earthing wire disconnection is detected, the operation of the electrical or electronic device is automatically stopped. Hence safety is improved.

The power supply control device preferably comprises: a first logical product operating circuit for carrying out a logical product operation on the output from the leakage judgment device and the output from the earthing wire disconnection detection apparatus, and a self hold circuit with the logical product output from the first logical product operating circuit as a reset input signal, and a rising signal due to switching on a power source as a trigger input signal, which self holds the trigger input signal, and the output from the self hold circuit is made the power supply permit signal.

With such a construction, if once the normal judgment output is stopped due to a leakage fault or an earthing wire disconnection fault, so that the output from the first logical product operating circuit becomes a logic value zero, then an output will not be produced from the self hold circuit unless the power source is again switched on. As a result, hunting of the switch device at normal times when the power supply is first started can be prevented.

More specifically, the power supply control device may comprise: an integrating circuit for integrating the power source switch on signal, a level detection circuit for level detecting an integration output from the integrating circuit and generating an output when this becomes equal to or more than a predetermined level, and a differentiating circuit for differentiating a rising output from the level detection circuit, and the differentiation output from the differentiating circuit is made the trigger input signal to the self hold circuit.

Moreover, the construction may be such that the trigger input signal to the self hold circuit is applied by switching on a manual switch.

More preferably, the power supply control device may comprise a power interruption protection circuit for maintaining the self hold circuit in an operable condition when the operating power source for the self hold circuit is interrupted, during a predetermined time from after power source interruption.

In this way, reset of the self hold circuit in the case where the power is stopped for a short time can be prevented.

When the detection device for the earthing wire disconnection detection apparatus is constructed according to claim 4, then the leakage judgment device may be constructed with at least one of the transformers as a saturable transformer incorporating a saturable magnetic core which becomes saturated when a current equal to or greater than a predetermined level flows thus causing a drop in the output level, and may be commonalized with the detection device.

With such a construction, in the case where respective windings or the like of the two transformers become disconnected, then an output indicating no leakage and normal earthing wires is not produced. Therefore, even at the time of a fault in the leakage judgment device or the earthing wire disconnection detection apparatus, power supply to the electrical or electronic device can be interrupted. Moreover, the overall circuit construction of the leakage detection apparatus can be simplified.

Furthermore, the construction may be such that the leakage judgment device includes a leakage detection transformer, having basically a primary winding and a secondary winding wound on a saturable magnetic core, with a pair of power supply lines to the electrical or electronic device passed through the saturable magnetic core of the leakage detection transformer, and a leakage detection signal is supplied to the primary winding, and a leakage judgment output is generated from the secondary winding.

Moreover, the construction may be such that when a plurality of electrical or electronic devices which are connected in parallel with each other are connected to the same power supply source via the switch device, then the leakage detection transformer is respectively provided for each of the electrical or electronic devices, the leakage detection transformers being connected in series with the leakage detection signal supplied to the primary winding of the first stage leakage detection transformer, and a leakage judgment output being generated from the secondary winding of the last stage leakage detection transformer, and the earthing wire disconnection detection apparatus is provided for each of the respective electrical or electronic devices, and a second logical product operating circuit is provided for carrying out a logical product operation on respective outputs from the respective earthing wire disconnection detection apparatus, and the logical product output from the second logical product operating circuit is made the judgment output for earthing wire disconnection.

With such a construction, then even in the case where a plurality of electrical or electronic devices are connected, it is possible to commonalize the signal supply source for the respective leakage detection transformers and the earthing wire disconnection detection apparatus provided for each of the electrical or electronic devices.

The switching device is basically an electromagnetic relay comprising; an excitor coil which is excited by a power supply permit signal from the power supply control device, and excitation contact points connected in series to the power supply line for the electrical or electronic device which are switched on when the excitor coil is excited.

BEST MODE FOR CARRYING OUT THE INVENTION

As follows is a description of an earthing wire disconnection detection apparatus according to a first aspect of the prsent invention, with reference to the drawings.

Figure 1:
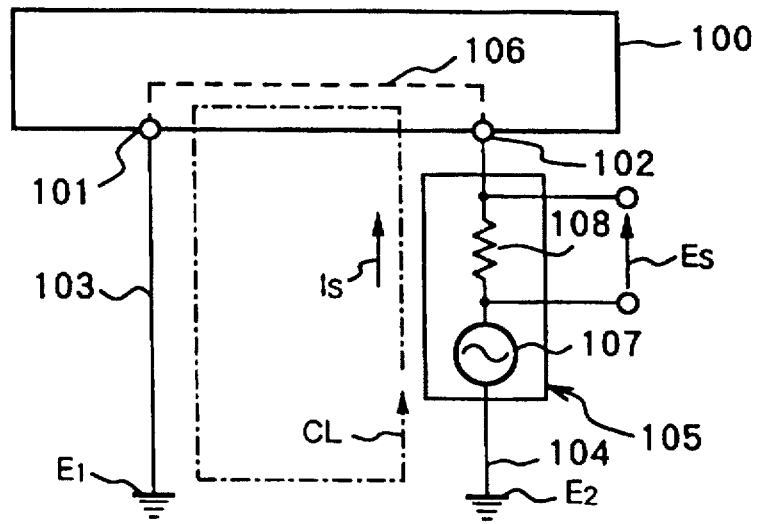
FIG. 1 is a schematic diagram showing an embodiment of an earthing wire disconnection detection apparatus according to the present invention.

FIG. 1 is a schematic diagram showing an embodiment of an earthing wire disconnection detection apparatus according to the present invention.

The earthing wire disconnection detection apparatus according to the present invention is for detecting disconnection of an earthing wire between an electrical or electronic device 100 and earth. The apparatus includes; two earthing wires 103, 104 with respective one ends connected to two earth terminals 101, 102 on an electrical or electronic device 100 side, and respective earth terminals E1, E2 at the other ends connected to earth, and a detection circuit 105 serving as a detection device. The electrical or electronic device side earth terminals 101, 102 are provided independent of each other and are electrically connected together by means of, for example the case or the interior wiring or the like on the electrical or electronic device 100 side. Wiring 106 illustrated by a dashed line, is inside the electrical or electronic device 100, and serves as earthing wiring for connecting the earth terminals 101, 102 together. The two earth terminals E1, E2 of the earthing wires 103, 104 are earthed independent of each other. The earth terminal 101 and the earth terminal 102 on the electrical or electronic device 100 side, and the earth terminal E1 and the earth terminal E2 on the earth side, are, with the present embodiment, necessarily independent of each other. The spacing may however be very small of for example a few millimeters. The earthing wires 103, 104, the wiring 106 of the electrical or electronic device 100, and the earth, are connected together so as to make up a single closed loop CL.

The detection circuit 105 is connected to the closed loop CL, and judges the earthing wires to be normal when the closed loop CL is closed, and judges the earthing wires to be abnormal when the closed loop CL is not closed. In FIG. 1, the detection circuit 105 has a signal supply source 107 which supplies a detection current Is, and a current detection resistor 108. The presence of a current flowing in the closed loop CL is judged based on a terminal voltage Es of the current detection resistor 108, to thereby judge normal or abnormal. While not shown in the figure, instead of the current detection resistor 108, a current probe electromagnetically coupled with the detection current Is, may be used.

With the above arrangement, in order to detect a disconnection of the earthing wires 103, 104 between the electrical or electronic device 100 and the earth, the two earthing wires 103, 104 are provided connecting to the two mutually independent earth terminals 101, 102 in the electrical or electronic device 100, so that a single closed loop CL is made up of the earthing wires 103, 104, the electrical or electronic device 100 and the earth. Therefore, when the earthing wires 103, 104 between the electrical or electronic device 100 and the earth are normal, the closed loop CL conducts so that the electrical or electronic device 100 is earthed.

In the case where an abnormality arises, such as a disconnection in the earthing wires 103, 104 between the electrical or electronic device 100 and earth, then the closed loop CL will no longer be closed (becomes open). Therefore, by judging normal to be when the closed loop is closed, and abnormal to be when the closed loop is not closed, it is possible to detect if the earth is normal, and also if one or both of the earthing wires 103, 104 are disconnected. Hence an abnormality in the circuit operation of the electrical or electronic device 100, or electrocution or the like due to leakage, can be prevented.

Moreover, since the two mutually independent earth terminals 101, 102 are provided in the electrical or electronic device 100, thus giving a dual system in relation to the earth, and these earth terminals 101, 102 are connected to each other by the earthing wiring 106 inside the electrical or electronic device 100, then if the earthing wiring 106 inside the electrical or electronic device 100 is disconnected, the closed loop CL will not be closed. Consequently, disconnection of the earthing wiring 106 inside the electrical or electronic device 100 can be detected.

Furthermore, since the two earth terminals E1, E2 are provided on the earth side and earthed independent of each other, then also in the case where one or other of the earth side earth terminals E1, E2 is disconnected from earth, the closed loop CL will not be closed. Therefore, when at least one of the earth side earth terminals E1 or E2 becomes disconnected from earth, this can be detected. Supposing however that the earth terminals which should be provided on the earth side are made as one common terminal so that a similar closed loop is constructed, then it is not possible to detect if the earth terminal (common terminal) on the earth side has disconnected from earth.

The detection circuit 105 shown in FIG. 1 judges normal or abnormal from the presence of the detection current Is flowing in the closed loop CL. Therefore for example, by providing in the closed loop CL, the signal supply source 107 for supplying a detection current Is, and the current detection resistor 108, or a current probe (not shown in the figure) for electromagnetic coupling with the detection current Is, then it is possible to easily judge if the closed loop CL is closed or is not closed.

Figure 2:
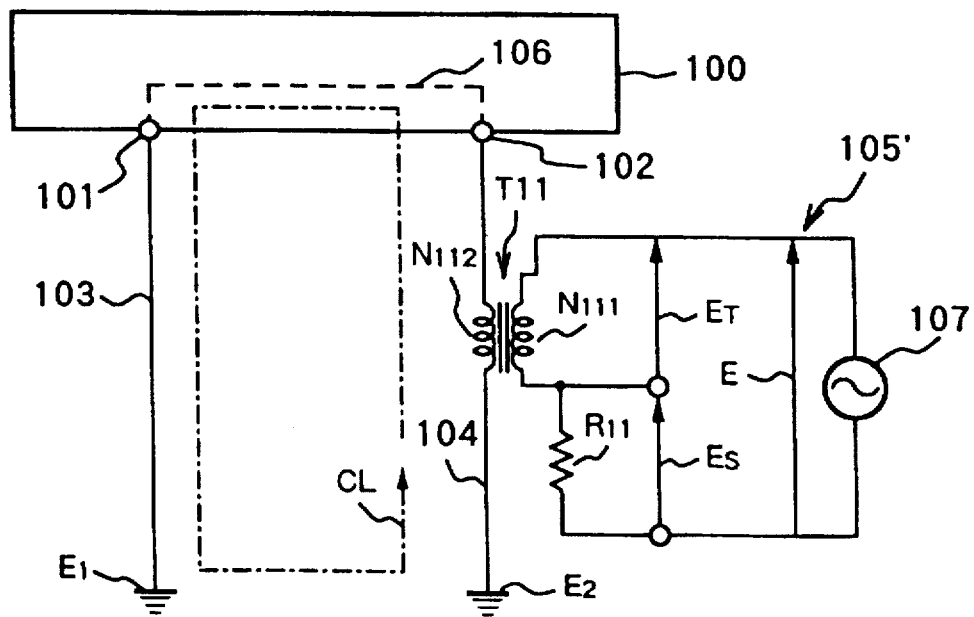
FIG. 2 is a schematic diagram showing another embodiment of an earthing wire disconnection detection apparatus according to the present invention.

FIG. 2 is a diagram for explaining another embodiment of an earthing wire disconnection detection apparatus according to the present invention. In FIG. 2 components the same as in FIG. 1 are denoted by the same symbols.

A detection circuit 105' of this embodiment includes a transformer T11. A secondary winding $N_{112}$ of the transformer T11 is connected into a closed loop CL. An earthing wire disconnection detection signal is supplied to a primary winding $N_{111}$ of the transformer T11, and the earthing wire disconnection detection signal is sampled as a change in the inductance of the transformer T11. The earthing wire disconnection detection signal is supplied from a signal supply source 107 to the primary winding $N_{111}$ of the transformer T11. A current reducing resistor $R_{11}$ is connected to the primary winding $N_{111}$ of the transformer T11. A self inductance L1 of the primary winding $N_{111}$ is set so that the impedance is greater than the resistance value of the current reducing resistor $R_{11}$.

With such a construction, then with the closed loop CL in the closed condition, the secondary winding $N_{112}$ is short circuited so that the terminal voltage $E_T$ of the primary winding $N_{111}$ drops remarkably to a low level, and practically all of the output voltage E of the signal supply source 107 is applied to the current reducing resistor $R_{11}$, so that the terminal voltage ES of the current reducing resistor $R_{11}$ becomes a high level. With the earthing wire disconnected and the closed loop CL in the non closed condition, then the secondary winding $N_{112}$ is open circuited, so that the terminal voltage ET of the primary winding $N_{111}$ increases in accordance with the self inductance L1. As a result the terminal voltage ES of the current reducing resistor $R_{11}$ drops remarkably to a low level. Consequently, by judging the terminal voltage ES using a constant threshold value, then it is easy to judge if the closed loop CL is closed or not closed.

Although not shown in the figure, the combination of the earthing wire 106, the earth terminals 101, 102, the earthing wires 103, 104 and the earth terminals E1, E2 may be provided in duplicate. By adding an additional closed loop, then the reliability is further improved.

Next is a description with reference to FIG. 3 through FIG. 6, of examples of where the earthing wire disconnection detection apparatus according to the present invention is applied to a line filter circuit. In these figures, components the same as in FIG. 1 and FIG. 2 are denoted by the same symbols.

Figure 3:
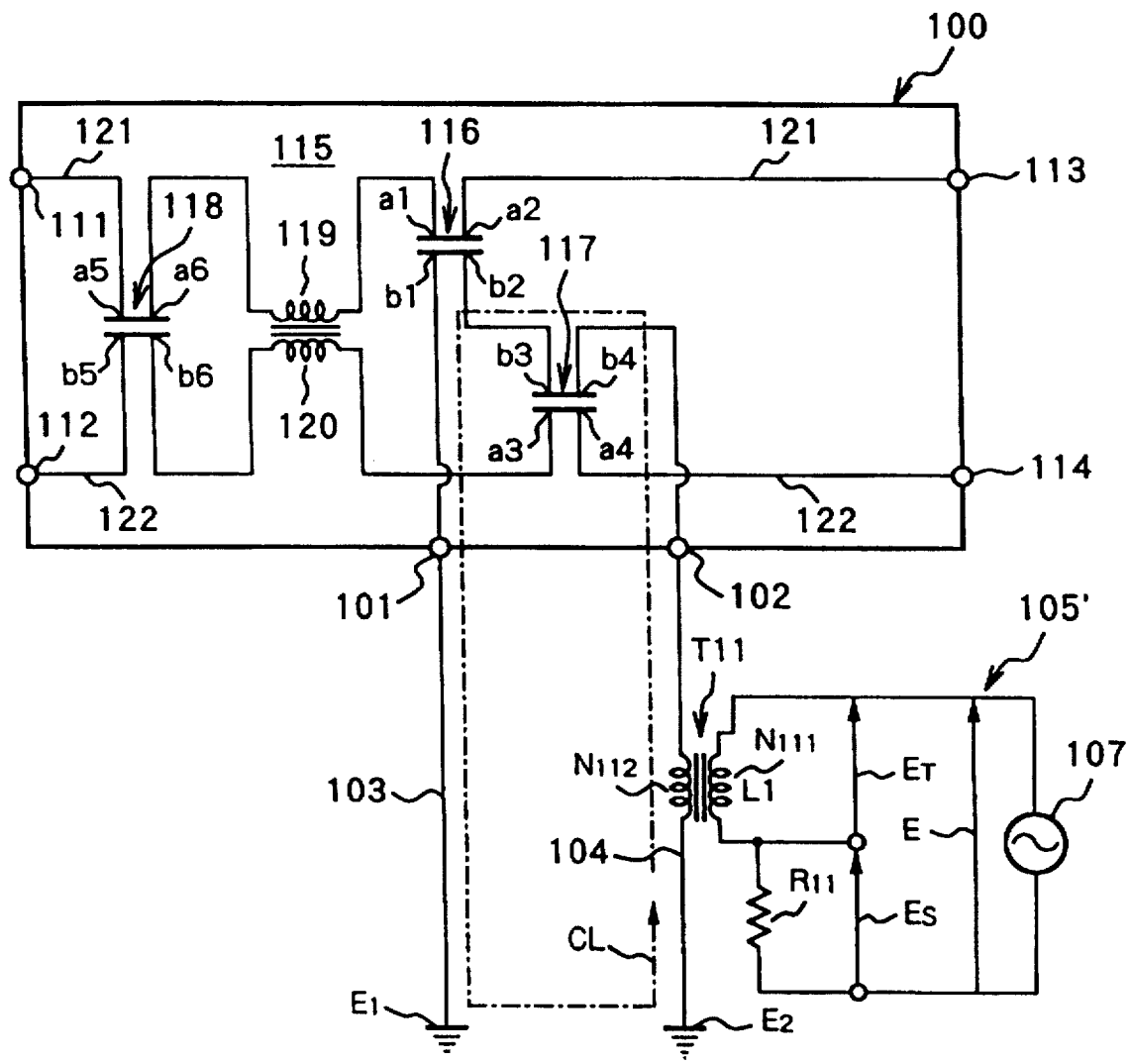
FIG. 3 is a circuit diagram showing an example with an earthing wire disconnection detection apparatus of a second embodiment applied to a line filter circuit.

At first with the embodiment shown in FIG. 3, reference symbols 111, 112 denote input terminals while reference symbols 113, 114 denote output terminals. Here the electrical or electronic device 100 includes a line filter circuit 115 for absorbing noise from a power source line. A commercial power source or a signal source is connected to the input terminals 111, 112, while a load is connected to the output terminals 113, 114.

The line filter circuit 115 includes at least two capacitors 116, 117. Each of the capacitors 116, 117 comprises a four terminal capacitor. With the four terminal capacitor 116, each capacitor electrode has two mutually independent terminals (a1, a2) and (b1, b2). With the four terminal capacitor 117 also, each capacitor electrode has two mutually independent terminals (a3, a4) and (b3, b4).

The terminals a1, a2 of the four terminal capacitor 116 are connected in series to a line 121 so as to form a circuit with the terminal a1, the capacitor electrode and the terminal a2 in series. The terminals a3, a4 of the four terminal capacitor 117 are connected in series to a line 122 so as to form a circuit with the terminal a3, the capacitor electrode, and the terminal a4 connected in series. The terminal b2 of the four terminal capacitor 116 and the terminal b3 of the four terminal capacitor 117 are connected to each other. The terminal b1 of the four terminal capacitor 116 is connected to an earth terminal 101, while the terminal b4 of the four terminal capacitor 117 is connected to an earth terminal 102. The lines 121, 122 are used as transmission lines for the power or the signal.

With such a construction, in the case where any of the terminals b1, b2 of the four terminal capacitor 116, or the terminals b3, b4 of the four terminal capacitor 117 are disconnected, then the closed loop CL can not be formed. Consequently, a disconnection in the terminals b1–b4 of the four terminal capacitors 116, 117 can be detected so that a loss in the normal noise filtering operation of the line filter circuit 114 can be detected at an early stage.

The line filter circuit 115 shown in FIG. 3 includes a separate capacitor 118 and a choke coil having two windings 119, 120. The separate capacitor 118 is a four terminal capacitor with two terminals a5, a6 provided on one of the capacitor electrodes, connected into the line 121, and two terminals b5, b6 provided on the other of the capacitor electrodes, connected into the line 122. The separate capacitor 118 is provided before the windings 119, 120 of the choke coil, and has the effect of absorbing normal mode noise.

Since as described above, the separate capacitor 118 comprises a four terminal capacitor, then if a disconnection occurs in any of the terminals a5, a6, b5, b6, power transmission or signal transmission becomes impossible. Therefore, the undesirable situation of power transmission or signal transmission being carried even though the noise filtering operation by the separate capacitor 118 included in the line filter circuit 115 has ceased, can be avoided.

The choke coil having the two windings 119, 120, is known as common noise choke coil, and is wound for example around a single toroidal core, and connected into the lines 121, 122 between the separate capacitor 118 and the capacitors 116, 117.

Figure 4:
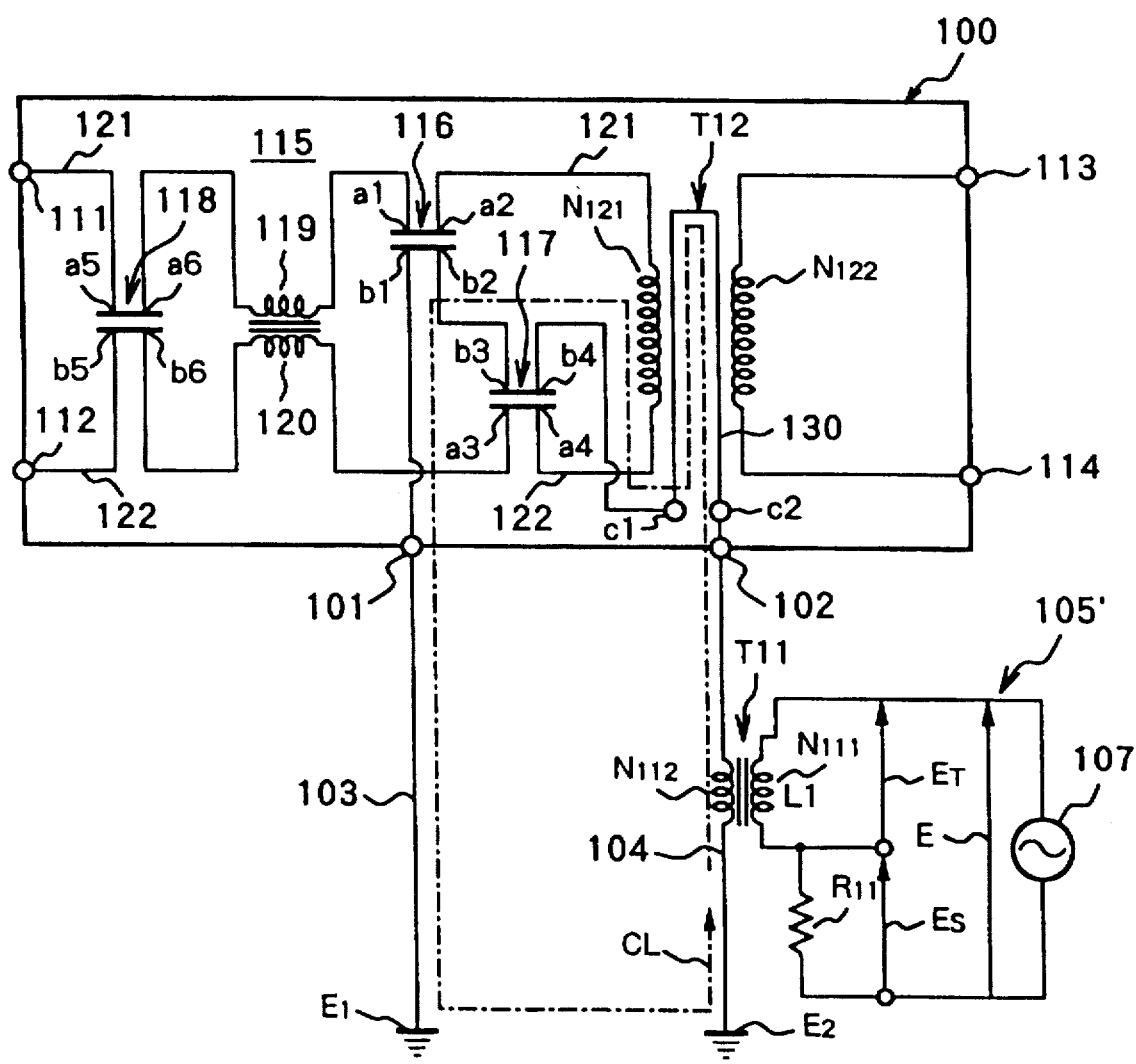
FIG. 4 is a circuit diagram showing an embodiment with the earthing wire disconnection detection apparatus of the second embodiment applied to a circuit having a transmission transformer connected to a line filter circuit.

Next, with the embodiment shown in FIG. 4, an electrical or electronic device 100 further includes a transmission transformer T12. The transformer T12 is connected before or after a line filter circuit 115, and has an electrostatic shield 130 between a primary winding $N_{121}$ and a secondary winding $N_{122}$. With this embodiment, the transformer T12 is connected after the line filter circuit 115. The electrostatic shield 130 typically comprises a band like thin plate with two mutually independent electrodes c1, c2 on opposite lengthwise ends. The electrodes c1, c2 on the electrostatic shield 130 are included in series in the closed loop CL.

With such a construction, as well as earthing the electrostatic shield 130, disconnection thereof can also be detected.

Figure 5:
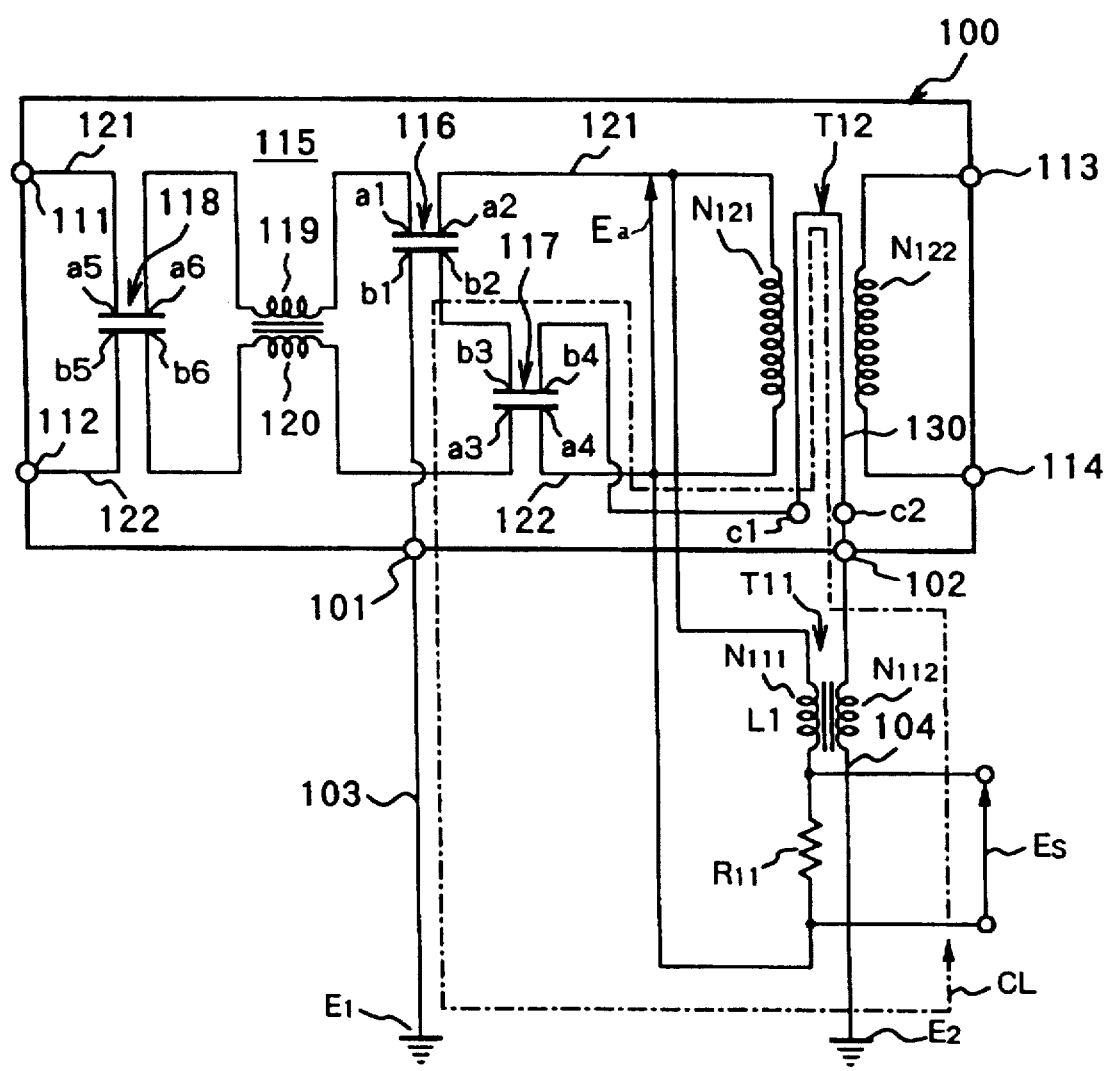
FIG. 5 is a circuit diagram showing another embodiment of an earthing wire disconnection detection apparatus according to the present invention applied to a circuit having a transmission transformer connected to a line filter circuit.

With the embodiment shown in FIG. 5, an input or output signal Ea for the line filter circuit 115 or the transformer T12 is used as an earthing wire disconnection detection signal. With such a construction, there is no need for special provision of the signal supply source 107, and hence cost is less.

Figure 6:
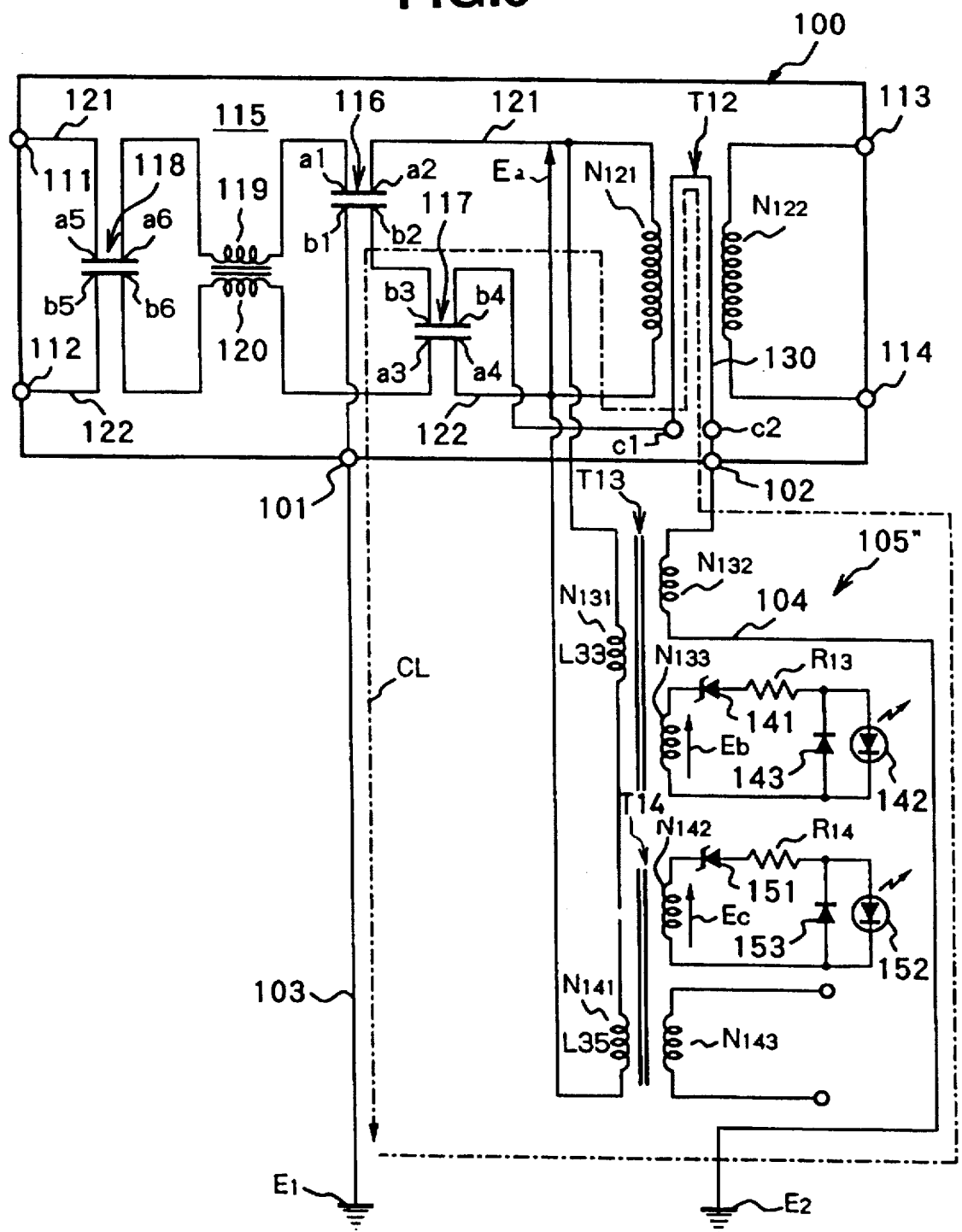
FIG. 6 is a circuit diagram showing yet another embodiment of an earthing wire disconnection detection apparatus of the present invention applied to a circuit having a transmission transformer connected to a line filter circuit.

Moreover, with the embodiment of FIG. 6, a detection circuit 105" incorporates two transformers T13, T14. Respective primary windings $N_{131}$, $N_{141}$ of the transformers T13, T14 are connected in series. A secondary winding $N_{132}$ of the transformer T13 is connected in series to the closed loop CL, while a signal Ec for indicating whether or not the connection condition is normal, is produced in a secondary winding $N_{142}$ of the transformer T14.

To explain in more detail, a constant voltage diode 151, a current reducing resistor R14, and a light emitting element 152 are connected in series to the secondary winding N142. A reverse voltage protection diode 153 is connected to the light emitting element 152. A tertiary winding N133 of the transformer T13 produces a detection signal Eb for indicating an abnormality related to the earth condition. A constant voltage diode 141, a current reducing resistor R13 and a light emitting element 142 are connected in series to the tertiary winding N133. A reverse voltage protection diode 143 is connected to the light emitting element 142. The constant voltage diodes 141, 151 set a threshold value for illumination of the light emitting elements 142 and 152.

Under conditions where the closed loop CL is formed, the voltage level of the primary winding $N_{131}$ of the transformer T13 becomes a low level, so that practically all of the voltage of the output signal Ea output from the line filter circuit 115 is applied to the primary winding $N_{141}$ of the transformer T14. A high level detection signal Ec is thus obtained from the secondary winding $N_{142}$ of the transformer T14. The light emitting element 152 is thus illuminated by the detection signal Ec, and the normal condition displayed.

Under conditions when the closed loop CL is not formed, the voltage of the output signal Ea from the line filter circuit 115 is voltage divided by the transformer T13 and the separate transformer T14. A self inductance L33 of the primary winding $N_{131}$ of the transformer T13 is set greater than a self inductance L35 of the primary winding $N_{141}$ of the transformer T14. Therefore the detection signal Eb of the tertiary winding $N_{133}$ of the transformer T13 rises, while the detection signal Ec of the secondary winding $N_{142}$ of the transformer T14 falls. Consequently, the light emitting element 142 is illuminated by the detection signal Eb, while the light emitting element 152 is extinguished by the detection signal Ec, thus displaying the abnormal condition. In cases where the self inductance L33 of the primary winding $N_{131}$ of the transformer T13 is set greater than the self inductance L35 of the primary winding $N_{141}$ of the transformer T14, then the rise and the fall in the voltage between the transformer T13 and the transformer T14 due to opening of the closed circuit CL becomes great. Hence disconnection detection is simplified.

A similar disconnection detection can be carried out using the voltage produced in a tertiary winding $N_{143}$ of the transformer T14, accompanying the normal and abnormal conditions of the closed loop CL. In this case, the voltage occurring in the tertiary winding $N_{143}$ is transmitted to a signal receiving device located at a remote location, and the abovementioned disconnection detection carried out by this signal receiving device.

As described above, by providing the two earthing wires for the electrical or electronic device and making up a single closed loop from the respective earthing wires, the electrical or electronic device, and the earth, and having a construction for detecting if the closed loop is closed or not, then it is possible to monitor for disconnection of the earthing wire, even during operation of the electrical or electronic device. Consequently, an abnormality in the operation of the electrical or electronic device, or electrocution or the like due to leakage can be prevented.

Next is a description of a leakage detection apparatus incorporating an earthing wire disconnection detection function, according to a second aspect of the present invention, which utilizes the earthing wire disconnection detection principle of the first aspect of the present invention for detecting a disconnection in an earthing wire of a single closed loop made up using the earthing wire.

Figure 7:
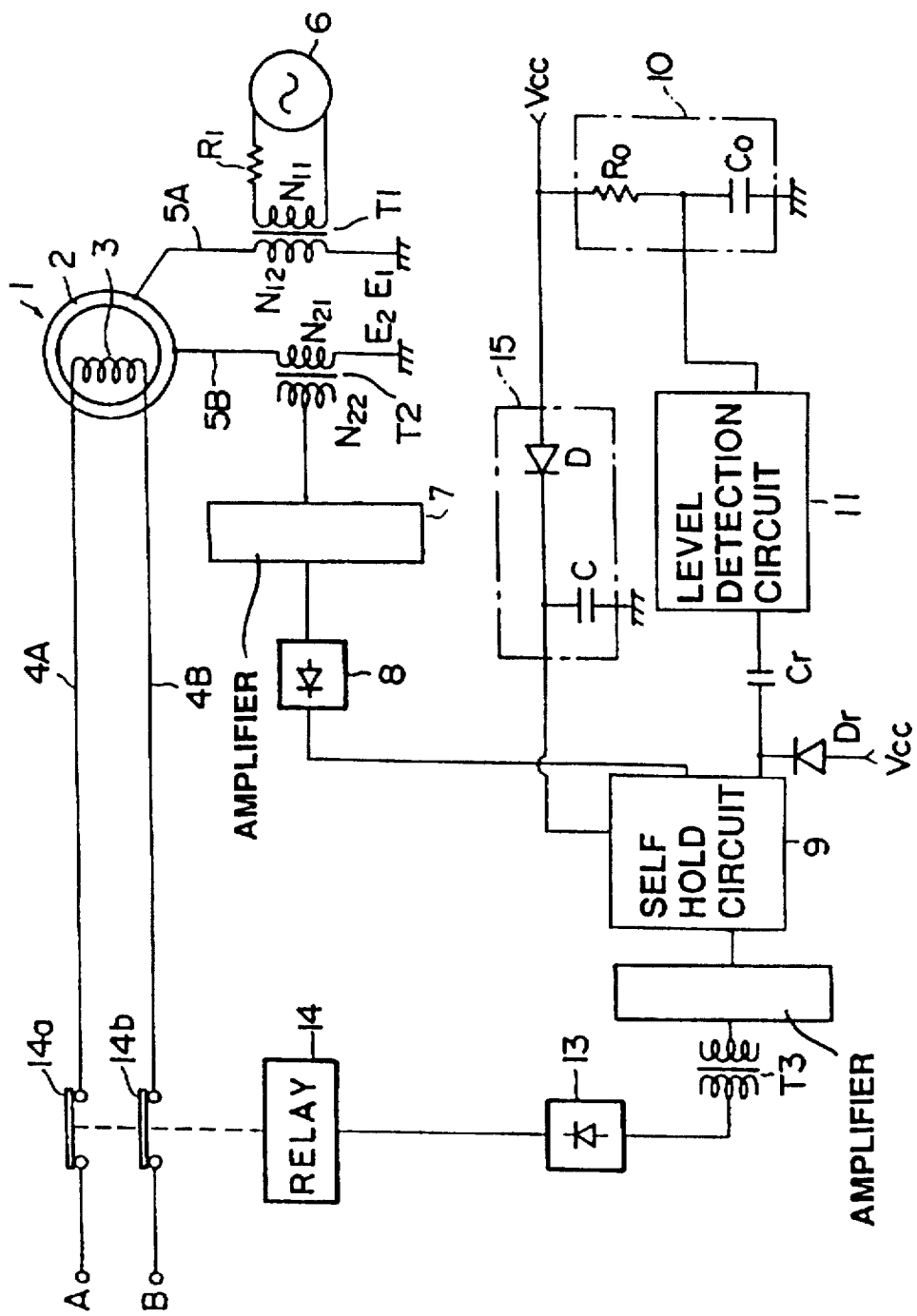
FIG. 7 is a circuit diagram illustrating an embodiment of a leakage detection apparatus according to the present invention.

FIG. 7 shows a circuit diagram of a first embodiment of a leakage detection apparatus according to the invention.

In FIG. 7, a motor 1 serving as, for example, an electrical or electronic device, has a motor coil 3 housed inside a motor case 2. The motor coil 3 is connected to an AC power source (not shown in the figure) by way of terminals A and B of a pair of power supply lines 4A, 4B. Excitation contact points 14a, 14b provided in an electromagnetic relay 14 serving as a switch device (described later) are connected in series with the power supply lines 4A, 4B. The excitation contact points 14a, 14b are linked together in operation. Two earthing wires 5A, 5B earthed via earth terminals E1, E2, are connected to the motor case 2. The ends of the earthing wires 5A, 5B on the motor case 2 side are electrically connected via the motor case 2. Consequently, a single closed loop is made up from the motor case 2, the earthing wires 5A, 5B, and the earth.

A first transformer T1 for supplying a signal used for disconnection and leakage detection, to the closed loop, is connected to the earthing wire 5A. The first transformer T1 has a primary winding $N_{11}$ connected in series with a signal generator 6 via a current reducing resistor $R_1$, and a secondary winding $N_{12}$ connected in series with the earthing wire 5A. Furthermore, a second transformer T2 for generating a disconnection and leakage detection output based on a signal supplied to the closed loop from the first transformer T1, is connected to the other earthing wire 5B. The second transformer T2 incorporates a primary winding N21 connected in series with the earthing wire 5B, and a secondary winding $N_{22}$ for generating the disconnection and leakage detection output based on the level of the current flowing in the primary winding $N_{21}$. The first and second transformers T1, T2 have a core with their respective windings wound thereon, and constitute saturable transformers which use a saturable magnetic body core which becomes saturated when an leakage current flows in the earthing wires 5A, 5B so that a current level flowing in the closed loop becomes a predetermined level or above. Here one or other of the first and second transformers T1, T2 may be a saturable transformer. This type of current transformer which uses a saturable magnetic core is disclosed for example in International Patent Publication No. WO94/23307.

An output from the secondary winding $N_{22}$ of the second transformer T2 is amplified by an AC amplifier 7, voltage doubler rectified by a voltage doubler rectifying circuit 8, and then input to a reset terminal of a self hold circuit 9.

Here the earthing wire disconnection detection apparatus comprises: the signal generator 6, and the first and second transformers T1, T2 connected to the closed loop made up of the earthing wires 5A, 5B. Furthermore, with the present embodiment, by making the first and second transformers T1, T2 saturable transformers, then the earthing wire disconnection detection apparatus has the function of a leakage judgment device. Hence the earthing wire disconnection detection apparatus and the leakage judgment circuit serving as the leakage judgment device are commonalized.

A power source voltage Vcc from a power source for the earthing wire disconnection detection apparatus is applied as a trigger input signal to a trigger terminal of the self hold circuit 9 passing through an integrating circuit 10 comprising a resistor Ro and a capacitor Co, a level detection circuit 11 which generates an output of logic value 1 when the integral output from the integrating circuit 10 becomes a predetermined level or above, and a differentiating capacitor Cr which differentiates the output from the level detection circuit 11, and is clamped to the power source voltage Vcc by a clamping diode Dr. The construction is such that an AC output is generated (the output becomes logic value 1) only when a reset input signal equal to or greater than a predetermined level is input together with the trigger input signal, and this output signal is rectified by a rectifier (not shown in the figure) and the resultant rectified output signal is fed back to the trigger terminal to self hold the output.

The output from the self hold circuit 9 is amplified by an amplifier 12, then passes via a third transformer T3 which uses a normal transformer, and is rectified by a full wave rectifying circuit 13. The resultant output is then supplied as a power supply permit signal to an excitation coil of an electromagnetic relay 14 which has the beforementioned excitation contact points 14a, 14b.

The operating power source Vcc for the self hold circuit 9, is supplied via a power interruption protection circuit 15 comprising a diode D and a capacitor C.

Here the self hold circuit 9, the integrating circuit 10, the level detection circuit 11, the capacitor Cr, the AC amplifier 12, the third transformer T3, the full wave rectifying circuit 13, and the power interruption protection circuit 15, constitute a power supply control device.

The voltage doubler rectifying circuit 8, is heretofore known for example from U.S. Pat. No. 5,027,114, and International Patent Publication No. WO94/23303, and comprises two capacitors and two diodes, arranged so as to generate an output with the voltage Vcc superimposed on the input signal.

The self hold circuit 9 has a fail-safe construction, generating an AC signal (logic value 1) only when an input signal of a higher level than the power source voltage Vcc is input simultaneously to the reset terminal and the trigger terminal, and not generating an AC signal (logic value 0) at the time of a fault. This type of fail-safe self hold circuit is constructed using a fail-safe AND gate comprising a plurality of resistors and transistors, and is known for example from U.S. Pat. No. 4,757,417, U.S. Pat. No. 5,027,114, and International Patent Publication Nos. WO94/23303, and WO94/23496.

The AC amplifiers 7 and 12 have a fail-safe construction which does not generate an output at the time of a fault, and are known for example from International Patent Publication Nos. WO94/23303, and WO94/23307.

Next is a description of the operation of the circuit of FIG. 7.

When the power source for the earthing wire disconnection detection apparatus is switched on, the AC signal from the signal generator 6 is applied to the primary winding $N_{11}$ of the first transformer T1 via the current reducing resistor $R_1$, and flows from the secondary winding $N_{12}$ of the first transformer T1 in the closed loop of the earthing wires 5A, 5B, the motor case 2 and the earth. It is then sampled from the secondary winding $N_{22}$, via the primary winding $N_{21}$ of the second transformer T2. The output signal from the secondary winding $N_{22}$ of the second transformer T2 is amplified by the AC amplifier 7, voltage doubler rectified by the voltage doubler rectifying circuit 8, and input to the self hold circuit 9 as a reset input signal.

Figure 8:
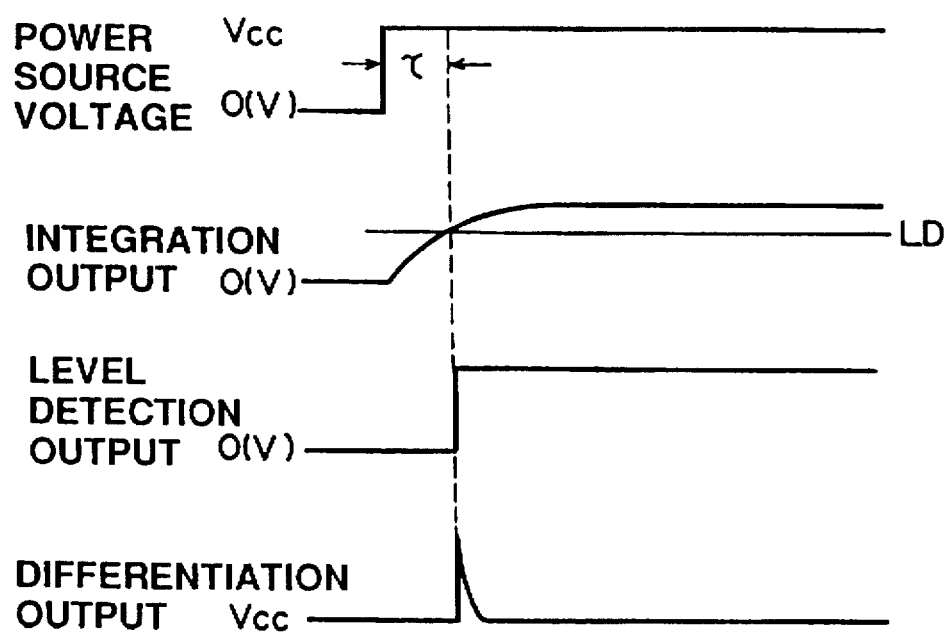
FIG. 8 is a time chart illustrating trigger input timing of a self hold circuit of the embodiment of FIG. 7.

On the other hand, as shown in FIG. 8, concurrent with switching on the power source voltage Vcc for the earthing wire disconnection detection apparatus, the output from the integrating circuit 10 gradually rises depending on the time constant determined by the resistor Ro and the capacitor Co, so that the integral output from the integrating circuit 10 is delayed by a time τ from the switching on of the power, until it exceeds a previously set threshold value LD of the level detection circuit 11. When this is exceeded, the level detection circuit 11 generates an output which is differentiated by the capacitor Cr, clamped at the power source voltage Vcc by the diode Dr and then input to the trigger terminal of the self hold circuit 9.

Therefore, when the power is switched on, if the earthing wires 5A, 5B are normal, the AC signal from the signal generator 6 is transmitted to the second transformer T2 from the first transformer T1 via the closed loop, so that the output level from the secondary winding N22 becomes a high level (logic value 1), and a reset input signal higher than the predetermined level is input to the reset terminal of the self hold circuit 9. Consequently, at the point in time of inputting the trigger input signal, an output of logic value 1 is generated from the self hold circuit 9 to give self hold. A DC signal is thus applied to the electromagnetic relay 14 via the amplifier 12, the third transformer T3 and the full wave rectifying circuit 13, to cause excitation. The excitation contact points 14a, 14b are thus switched on, starting power supply to the motor coil 3 from the AC power source applied to the terminals A, B, via the power supply lines 4A, 4B, and starting the motor 1.

On the other hand, if when the power is switched on, there is for example a fault in one or both of the earthing wires 5A, 5B, then the AC signal supplied from the signal generator 6 to the first transformer T1 is not transmitted to the second transformer T2. Hence the output from the secondary winding N22 of the second transformer T2 becomes zero, and an input signal is not input to the reset terminal of the self hold circuit 9. Consequently, even if a trigger input signal is input, there is no output from the self hold circuit 9. Therefore, the electromagnetic relay 14 is not excited and the excitation contact points 14a, 14b remain off so that power is not supplied to the motor coil 3, and the motor 1 does not start.

Moreover, during operation of the motor 1, in the situation where for example the motor coil 3 contacts the case 2 causing a leakage, with an earth current flowing in the earthing wires 5A, 5B, then due to this earth current, the saturable magnetic core of the first and second transformers T1, T2 becomes saturated and the signal level transmitted from the primary side windings to the secondary side windings of the respective transformers T1, T2 drops considerably. Therefore, the signal level input to the AC amplifier 7 becomes very small so that the reset input signal level to the self hold circuit 9 becomes smaller than the predetermined level thus stopping the output from the self hold circuit 9. Consequently, the electromagnetic relay 14 becomes non excited, so that the excitation contact points 14a, 14b go off and the power supply to the motor coil 3 is stopped, thus immediately stopping the operation of the motor 1.

With this construction, a closed loop is formed by providing the two earthing wires 5A, 5B, and the current flowing in this closed loop is monitored. Therefore, prior to supplying power to the motor 1, monitoring for a disconnection fault in the earthing wires 5A, 5B can be carried out to check if power can be supplied to the motor 1. Moreover, disconnection of the earthing wires 5A, 5B, and leakage can be continuously monitored, even during power supply to the motor 1. Therefore, if a disconnection of the earthing wires 5A, 5B, or leakage is detected during operation of the motor 1, power supply to the motor 1 can be immediately stopped, so that an accident such as electrocution of the operator can be prevented. A normal judgment signal is self held by the self hold circuit 9, and if an abnormal judgment output is once produced so that the output from the self hold circuit 9 is stopped, then an output will not be produced from the self hold circuit 9 provided a trigger input signal is not again applied. Therefore in the case of a leakage condition where power is being supplied due to an output from the self hold circuit 9, with the connection condition of the earthing wires 5A, 5B normal, hunting (repeated on and off switching) of the excitation contact points 14a, 14b can be prevented.

Furthermore, if a fault occurs in the respective windings of the first and second transformers T1, T2, then the output level of the judgment output indicating normal earthing wires with no leakage drops, so that the output from the self hold circuit 9 is stopped. Furthermore, in the case where a fault occurs in the circuit itself comprising the AC amplifier 7, the voltage doubler rectifying circuit 8 and the self hold circuit 9, the output from the self hold circuit 9 is stopped. Consequently, if a fault occurs in the leakage detection apparatus itself, the power supply to the motor 1 is stopped, thus giving exceptional safety and reliability.

Moreover, since the construction is such that the trigger input signal is delayed through using the integrating circuit 10 and the level detection circuit 11, then the trigger input signal can be reliably input after input of the reset input signal. Hence operational safety of the self hold circuit 9 is ensured.

Furthermore, if the operating power source Vcc for the self hold circuit 9 is stopped, then due to operation of the power interruption protection circuit 15, operation of the self hold circuit 9 can continue from the time of stopping the power source until the charge current in the capacitor C drops by a certain amount. Therefore the self hold circuit 9 is not reset with a temporary power interruption. Consequently, if this is within the interruption period in which the power interruption protection circuit 15 functions, then the monitoring function for disconnection and leakage can be automatically started simultaneously with restoration of the power source, without reapplying a trigger input signal to the self hold circuit 9.

Figure 9:
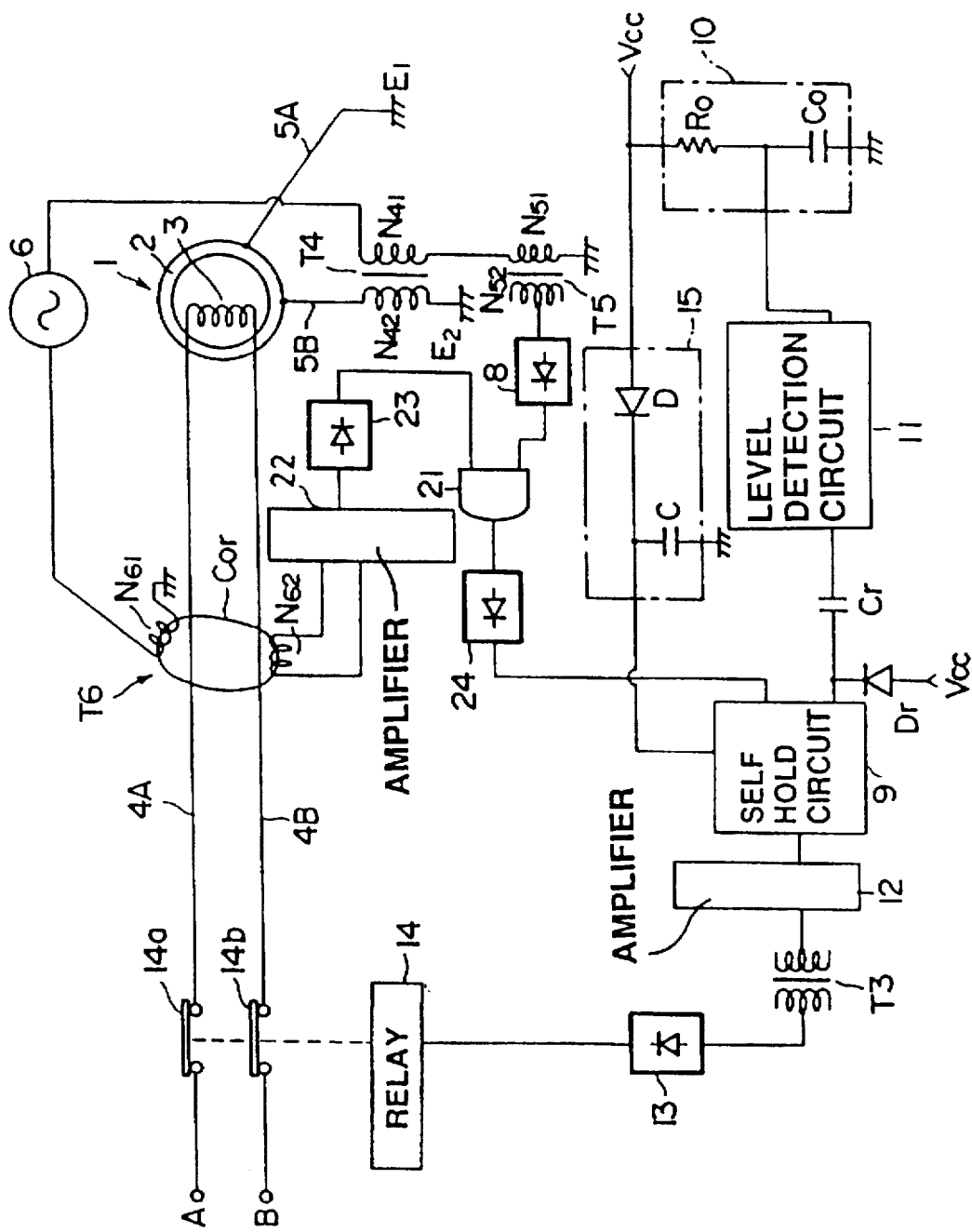
FIG. 9 is a circuit diagram illustrating another embodiment of a leakage detection apparatus according to the present invention.

Next is a description of a second embodiment of the invention with reference to FIG. 9.

This embodiment is an example of where leakage detection is carried out by monitoring for an imbalance current in the power supply lines 4A, 4B. Components the same as for the first embodiment shown in FIG. 7 are indicated by the same symbols and description is omitted.

With the embodiment in FIG. 9, the construction of the switch device and the construction of the power supply circuit for the motor 1 are the same as for the first embodiment of FIG. 7. However the construction of the components for detecting disconnection and leakage are different.

With this embodiment, an earthing wire disconnection detection apparatus is made up of a fourth transformer T4 serving as an earthing wire disconnection detection transformer, and a fifth transformer T5 serving as a disconnection judgment output generating transformer. Moreover, a leakage judgment device is made up of a sixth transformer T6 serving as a leakage detection transformer.

The fourth transformer T4 has a primary winding $N_{41}$ connected in series to a signal generator 6, and a secondary winding $N_{42}$ connected in series to, for example, the earthing wire 5B side of two earthing wires 5A, 5B which are connected to a motor case 2. The fifth transformer T5 has a primary winding $N_{51}$ connected in series between the primary winding $N_{41}$ of the fourth transformer T4 and an earth terminal E2, with an output from a secondary winding $N_{52}$ input via a voltage doubler rectifying circuit 8, to one input terminal of an AND gate 21 serving as a first logical product operating circuit to be described hereunder.

The sixth transformer T6 is made up by winding a primary winding N61 and a secondary winding $N_{62}$ onto a saturable magnetic core Cor, through which the pair of power supply lines 4A, 4B to the motor 1 pass. An AC signal from the signal generator 6 is applied to the primary winding $N_{61}$. This signal is then transmitted to the secondary winding $N_{62}$ via the saturable magnetic core Cor, amplified by an AC amplifier 22, rectified by a voltage doubler rectifying circuit 23, and then input to the other input terminal of the AND gate 21.

The primary side impedance of the fourth transformer T4 and the fifth transformer T5 is set so that under normal conditions with no disconnection, that of the fifth transformer T5 is higher than that of the fourth transformer T4. Therefore, in the case of no disconnection of the earthing wires 5A, 5B, the fourth transformer T4 is short circuited, and the output level from the secondary winding N52 of the fifth transformer T5 becomes a high level, while in the case where at least one of the earthing wires 5A, 5B is disconnected, then due to the primary side impedance of the fourth transformer T4, the output level from the secondary winding $N_{52}$ of the fifth transformer T5 becomes a low level or zero.

Moreover, since the directions of the current flowing in the power supply lines 4A, 4B are opposite to each other, then at normal times with no leakage, the magnetic fields due to the current flowing in the power supply lines 4A, 4B are mutually cancelled so that the saturable magnetic core Cor is not saturated. Therefore, the AC signal from the signal generator 6 which is applied to the primary winding $N_{61}$ of the sixth transformer T6 is transmitted to the secondary winding $N_{62}$ side, so that a high level output signal is produced from the secondary winding $N_{62}$. On the other hand, if there is leakage, then the current flowing in the power supply lines 4A, 4B becomes unbalanced so that a magnetic field corresponding to the current difference is produced, and the saturable magnetic core Cor becomes saturated. Therefore, the AC signal from the signal generator 6 applied to the primary winding $N_{61}$ of the sixth transformer T6, is not transmitted to the secondary winding $N_{62}$ side, and the output from the secondary winding $N_{62}$ thus becomes a low level.

The AND gate 21 is of a fail-safe construction, producing an output only when signals higher than a predetermined level are simultaneously input to the two input terminals, with the output being stopped at the time of a fault. The output from the AND gate 21 is rectified by a voltage doubler rectifying circuit 24, and then input to the reset terminal of the self hold circuit 9. With the present embodiment, the power supply control device has the AND gate 21 added to the construction of FIG. 7.

Such a fail-safe AND gate is heretofore known for example from U.S. Pat. No. 4,661,880, and International Patent Publication Nos. WO94/23303, and WO94/23496, as a fail-safe window comparator/AND gate.

Next is a description of the operation of the second embodiment of FIG. 9.

Before operating the motor 1, in the case where both of the earthing wires 5A, 5B are normal with no disconnections, then since the fourth transformer T4 is in a short circuit condition, the primary side impedance of the fifth transformer T5 is high. Therefore a high level output signal from the secondary winding $N_{52}$ is input to the voltage doubler rectifying circuit 8, and a resultant high level input signal is input to the AND gate 21. Moreover, a current does not flow in the power supply lines 4A and 4B, and the saturable magnetic core Cor of the sixth transformer T6 is not saturated. Therefore, the output level from the secondary winding $N_{62}$ is a high level and the resultant signal level input to the AND gate 21 via the AC amplifier 22 and the voltage doubler rectifying circuit 23 is also a high level. Consequently, a high level output signal (logic value 1) is generated from the AND gate 21, so that a high level signal is input to the reset terminal of the self hold circuit 9 via the voltage doubler rectifying circuit 24. As a result, as described in relation to FIG. 7, at the point in time of inputting the high level trigger input signal to the trigger terminal of the self hold circuit 9, the electromagnetic relay 14 is excited so that the excitation contact points 14a, 14b are switched on and power supply to the motor 1 is started.

After commencement of power supply, provided there is no leakage fault, then the current flowing in the power supply lines 4A, 4B flows in opposite directions and is in balance. Therefore the output level from the sixth transformer T6 does not change and remains in the high level condition. The electromagnetic relay T14 is thus maintained in the excited condition and power supply continues.

On the other hand, if a disconnection occurs in one or both of the earthing wires 5A, 5B, then the impedance of the primary winding N41 of the fourth transformer T4 is applied in series between the primary winding N51 of the fifth transformer T5 and the signal generator 6, and hence the output level from the secondary winding N52 of the fifth transformer T5 becomes a low level or zero. Therefore one of the input levels to the AND gate 21 becomes equal to or lower than the predetermined level so that the output from the AND gate 21 stops. As a result, the reset input signal level for the self hold circuit 9 drops, and the output from the self hold circuit 9 becomes a low level (logic value 0). The electromagnetic relay 14 thus becomes non excited, and the excitation contact points 14a, 14b go off, stopping the power supply to the motor 1.

Moreover, in the case of leakage, the current flowing in the power supply lines 4A, 4B becomes unbalanced, thus producing a magnetic field based on the difference, so that the saturable magnetic core Cor becomes saturated. The output level from the secondary winding N62 of the sixth transformer T6 thus becomes a low level and the input level to the AND gate 21 falls to or below the predetermined level so that the output from the AND gate 21 stops. The electromagnetic relay 14 thus becomes non excited, stopping power supply to the motor 1.

With this construction also, monitoring for a disconnection fault in the earthing wires 5A, 5B can be carried out prior to power supply to the motor 1, thus enabling checking of whether or not power can be supplied to the motor 1. Moreover, it is possible to continuously monitor for disconnection of the earthing wires 5A, 5B and for leakage, even during power supply to the motor 1. Consequently, leakage can be reliably detected, thus preventing an accident such as electrocution of the operator. Moreover, if a fault occurs in the respective windings of the fourth through sixth transformers T4~T6, then all of their output levels become a low level. Furthermore, in the case where a fault occurs in the AND gate 21 structural circuit itself, the output from the self hold circuit 9 stops. Consequently, if a fault occurs in the leakage detection apparatus itself, the power supply to the motor 1 is stopped, thus giving exceptional safety and reliability.

Furthermore, since the interruption protection circuit 15 is provided, as with the first embodiment, then the self hold circuit 9 is not reset with a temporary power interruption, and hence the monitoring function for disconnection and leakage is automatically started simultaneously with restoration of the power source.

Figure 10:
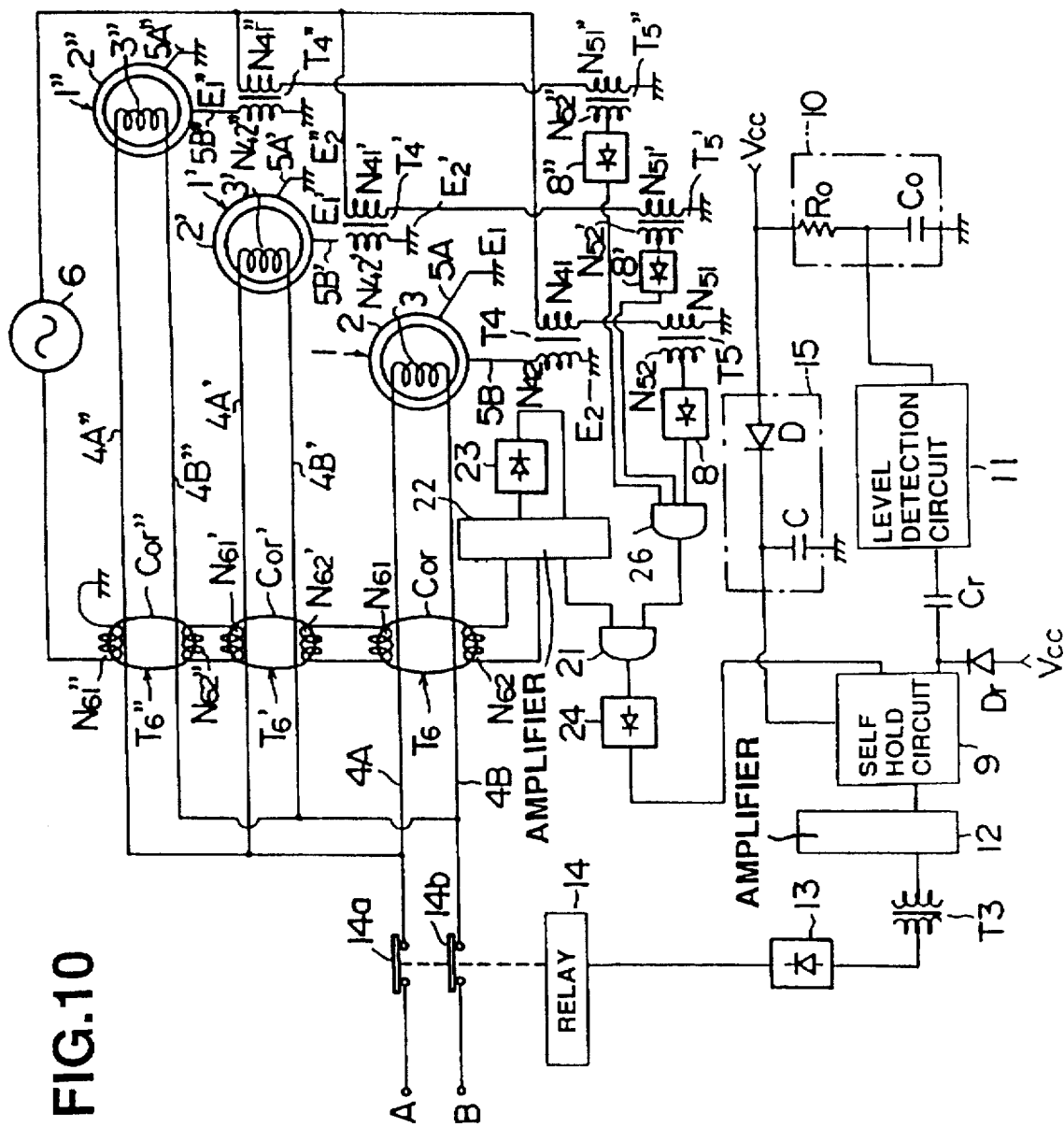
FIG. 10 is a circuit diagram illustrating yet another embodiment of a leakage detection apparatus according to the present invention.

Next is a description of a third embodiment of the invention with reference to FIG. 10.

This embodiment is an example of the case where a plurality of motors serving as electrical or electronic devices, are connected to the same power source, and detection of earthing wire disconnection and of leakage is carried out using the detection principle of the second embodiment shown in FIG. 9. Components the same as for the second embodiment shown in FIG. 9 are indicated by the same symbols and description is omitted.

In FIG. 10, a plurality of (for example three) motors 1, 1', 1" are connected in parallel with each other via excitation contact points 14a, 14b, to input terminals A, B of the same load power source.

Transformers T6, T6', T6" serving as leakage detection transformers, are provided for each of the pairs of power supply lines 4A, 4B, 4A', 4B', and 4A", 4B" of the respective motors 1, 1', and 1". Respective primary windings $N_{61}$, $N_{61}'$, and $N_{61}"$ and secondary windings $N_{62}$, $N_{62}'$, and $N_{62}"$ are wound around saturable magnetic cores Cor, Cor', and Cor" through which are passed the respective power supply lines 4A, 4B, 4A', 4B', and 4A", 4B". The transformers T6~T6" are connected in series by means of these windings. More specifically, a signal generator 6 is connected to the primary winding $N_{61}"$ of the first stage transformer T6", the secondary winding $N_{62}"$ is connected in series to the primary winding $N_{61}'$ of the transformer T6', the secondary winding $N_{62}'$ of the transformer T6' is connected in series to the primary winding $N_{61}$ of the last stage transformer T6, and the secondary winding $N_{62}$ of the transformer T6 is connected to an AC amplifier 22. Consequently, when all of the transformers T6~T6" are not saturated, the AC signal from the signal generator 6 is transmitted via the respective transformers T6~T6", and then input to one input terminal of an AND gate 21 via an AC amplifier 22 and a voltage doubler rectifying circuit 23.

On the other hand, respective pairs of earthing wires 5A, 5B, 5A', 5B', and 5A", 5B", are provided for the motors 1, 1', and 1". Secondary windings $N_{42}$, $N_{42}'$, $N_{42}"$ of transformers T4, T4', T4" serving as earthing wire disconnection transformers, are respectively connected in series to respective earthing wires 5B, 5B', 5B". Primary windings $N_{51}$, $N_{51}'$, $N_{51}"$ of transformers T5, T5', T5", serving as disconnection judgment output generating transformers, are connected in series to primary windings $N_{41}$, $N_{41}'$, $N_{41}"$ of the transformers T4, T4', T4". The series circuits of the primary windings $N_{41}$, $N_{41}'$, $N_{41}"$ of the transformers T4, T4', T4" and the primary windings $N_{51}$, $N_{51}'$, $N_{51}"$ of the transformers T5, T5', T5" are connected together in parallel, and connected to the signal generator 6. The outputs from the secondary windings $N_{52}$, $N_{52}'$, $N_{52}"$ of the respective transformers T5, T5', T5" are input to an AND gate 26, serving as a second logical product operating circuit, via respective voltage doubler rectifying circuits 8, 8', 8". The logical product output from the AND gate 26 is input to the other input terminal of the AND gate 21. The AND gate 26 has the same fail-safe construction as the AND gate 21.

Next is a description of the operation of the third embodiment of FIG. 10.

Before operation of the motors 1~1", then in the normal case with no disconnection in any of the earthing wires 5A~5A" and 5B~5B", the high level output signals from the secondary windings $N_{52}$~$N_{52}"$ of the respective transformers T5~T5" are input to the respective voltage doubler rectifying circuits 8~8". A high level output (logic value 1) is thus produced from the AND gate 26, and a high level input signal is input to the AND gate 21. Moreover, a current does not flow in the respective power supply lines 4A~4A" and 4B~4B", and the saturable magnetic cores Cor~Cor" of the respective transformers T6~T6" are not saturated. Therefore the AC signal from the signal generator 6 applied to the primary winding $N_{61}"$ of the transformer T6" is transmitted as far as the secondary winding $N_{62}$ of the transformer T6.

As a result, the output level from the secondary winding N62 becomes a high level, and a high level signal is input to the AND gate 21 via the AC amplifier 22 and the voltage doubler rectifying circuit 23. Consequently, a high level (logic value 1) output signal is generated from the AND gate 21, so that a high level signal is input to the reset terminal of the self hold circuit 9 via the voltage doubler rectifying circuit 24. As a result, at the point in time of inputting the high level trigger input signal to the trigger terminal of the self hold circuit 9, the electromagnetic relay 14 is excited so that the excitation contact points 14a, 14b are switched on and power supply to the respective motors 1~1" is started.

After commencement of power supply, provided there is no leakage fault, then the current flowing in the power supply lines 4A~4A" and 4B~4B" flows in opposite directions and is in balance. Therefore the respective transformers T6~T6" are not saturated so that the output level from the secondary winding N62 of the transformer T6 does not change and remains in the high level condition. The electromagnetic relay 14 is thus maintained in the excited condition and power supply continues.

If a disconnection occurs in at least one of the earthing wires 5A~5A" and 5B~5B", then the output level from one of the secondary windings $N_{52}$~$N_{52}$" of the transformers T5~T5" becomes a low level or zero. Therefore the output from the AND gate 26 becomes a low level (logic value 0) so that the output from the AND gate 21 stops. As a result, the reset input signal level for the self hold circuit 9 drops, and the output from the self hold circuit 9 becomes a low level (logic value 0). The electromagnetic relay 14 thus becomes non excited, and the excitation contact points 14a, 14b go off, stopping the power supply to all of the motors 1~1".

In the case where leakage occurs in one of the motors 1~1", then the saturable magnetic core through which the power supply lines to the motor in which leakage occurs passes, becomes saturated. Therefore the AC signal applied to the primary winding N61" of the transformer T6" is not transmitted as far as the secondary winding N62 of the final stage transformer T6. The input level to the AND gate 21 thus becomes a low level so that the output from the AND gate 21 stops. The electromagnetic relay 14 thus becomes non excited, so that power supply to the motors 1~1" is stopped.

The construction of the third embodiment has the effect that, in the case where a plurality of electrical or electronic devices are connected to the same load power supply, then the signal generator 6 for supplying a signal to the respective leakage and disconnection detection apparatus provided for each of the electrical or electronic devices, can be a single unit. Hence commonalization of the signal generator 6 can be achieved.

Figure 11:
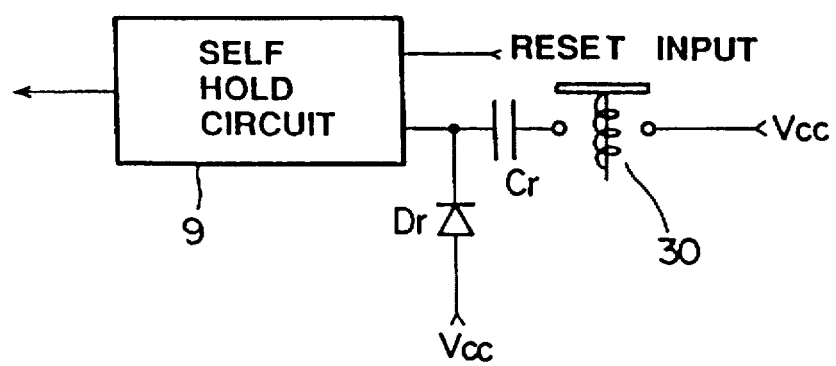
FIG. 11 is a partial circuit diagram illustrating another embodiment of an input method for the trigger input signal.

With the trigger signal for the self hold circuit 9, then as shown in FIG. 11, a construction is possible where this is input using a manual switch 30 which is switched on manually and automatically returns to the off position. In this case, the integrating circuit 10 and the level detection circuit 11 can be omitted. Furthermore, for the excitation contact point material of the electromagnetic relay 14, preferably a material such as silver cadmium oxide (AgCdO) which is not susceptible to contact point fusion is used.

Since the construction as described above is such that if a disconnection or leakage occurs in the earthing wires for an electrical or electronic device, the power supply source is immediately isolated from the electrical or electronic device, then accidents due to electrocution can be prevented so that operator safety can be ensured. Moreover, even if a fault occurs in the leakage detection apparatus itself, power supply to the electrical or electronic device is shut off. Hence reliability can be significantly improved.

INDUSTRIAL APPLICABILITY

With the present invention, at the time of using an electrical or electronic device, abnormal operation of the electrical or electronic device or an electrocution accident, due to disconnection or leakage of the earthing wire can be prevented. The invention thus gives exceptional safety, and hence industrial applicability is extensive.

We claim:

1. An earthing wire disconnection detection apparatus for detecting a disconnection of an earthing wire between an electrical or electronic device and earth, said apparatus: being provided with two earthing wires for respectively connecting an electrical or electronic device to earth, respective one ends of the two earthing wires being electrically connected to each other at the electrical or electronic device side, and respective other ends being earthed independent of each other to earth, thereby making up a single closed loop of the two earthing wires, the electrical or electronic device, and the earth; and incorporating detection means connected to said closed loop, which judges the earthing wires to be normal when said closed loop is closed, and which judges the earthing wires to be abnormal when said closed loop is not closed, wherein said detection means includes signal generating means for generating an earthing wire disconnection detection signal and a resistor to which said earthing wire disconnection detection signal is supplied, and judges whether the earthing wires are normal or abnormal based on voltage levels at both ends of said resistor.

2. An earthing wire disconnection detection apparatus according to claim 1, wherein said detection means includes a transformer, a secondary winding of said transformer being connected in series to said closed loop, a primary winding of said transformer being connected to said resistor in series, and said earthing wire disconnection detection signal is supplied from said signal generating means to a series circuit made up by said primary winding of the transformer and said resistor.

3. An earthing wire disconnection detection apparatus for detecting a disconnection of an earthing wire between an electrical or electronic device and earth, said apparatus: being provided with two earthing wires for respectively connecting an electrical or electronic device to earth, respective one ends of the two earthing wires being electrically connected to each other at the electrical or electronic device side, and respective other ends being earthed independent of each other to earth, thereby making up a single closed loop of the two earthing wires, the electrical or electronic device, and the earth; and incorporating detection means connected to said closed loop, which judges the earthing wires to be normal when said closed loop is closed, and which judges the earthing wires to be abnormal when said closed loop is not closed, wherein said detection means includes two transformers, primary windings of said respective transformers being connected in series with each other, a secondary winding of one of said two transformers being connected to said closed loop in series, and judges whether the earthing wires are normal or abnormal based on an output level from a secondary winding of the other of said two transformers.

4. An earthing wire disconnection detection apparatus according to claim 3, wherein said two earthing wires are connected together via earthing wiring inside said electrical or electronic device.

5. An earthing wire disconnection detection apparatus according to claim 4, wherein said electrical or electronic device is a line filter circuit.

6. An earthing wire disconnection detection apparatus according to claim 5, wherein said line filter circuit includes at least two capacitors, said two capacitors each being formed as a four terminal capacitor, and with each of said four terminal capacitors respective capacitor electrodes have two mutually independent terminals, with the two terminals connected to one of said capacitor electrodes, connected in series with a line so as to form a circuit with one of said terminals, said capacitor electrode and the other of said terminals in series, and with one of the two terminals connected to the other of said capacitor electrodes being connected to each other, and the other of said two terminals being connected separately to respective line filter circuit side ends of said two earthing wires.

7. An earthing wire disconnection detection apparatus according to claim 1, wherein said two earthing wires are connected together via earthing wiring inside said electrical or electronic device.

8. An earthing wire disconnection detection apparatus according to claim 7, wherein said electrical or electronic device is a line filter circuit.

9. An earthing wire disconnection detection apparatus according to claim 8, wherein said line filter circuit includes at least two capacitors, said two capacitors each being formed as a four terminal capacitor, and with each of said four terminal capacitors respective capacitor electrodes have two mutually independent terminals, with the two terminals connected to one of said capacitor electrodes, connected in series with a line so as to form a circuit with one of said terminals, said capacitor electrode and the other of said terminals in series, and with one of the two terminals connected to the other of said capacitor electrodes being connected to each other, and the other of said two terminals being connected separately to respective line filter circuit side ends of said two earthing wires.

10. A leakage and earthing wire disconnection detection apparatus for an electrical or electronic device, comprising:

two earthing wires for respectively connecting the electrical or electronic device to earth, respective one ends of the two earthing wires being electrically connected to each other at the electrical or electronic device, and respective other ends being connected independent of each other to earth, thereby providing a single closed loop, including the two earthing wires, the electrical or electronic device, and the earth;

detection means, connected to said closed loop, for judging the two earthing wires to be normal when said closed loop is closed, and for judging the two earthing wires to be abnormal when said closed loop is open;

leakage judgment means for judging the presence of leakage in said electrical or electronic device;

power supply control means for generating a power supply permit signal only when a judgment output indicating no leakage is generated from said leakage judgment means and simultaneously a judgment output is generated from said detection means indicating that the two earthing wires are normal; and switch means responsive to said power supply permit signal for connecting a power supply line for said electrical or electronic device to a power source.

11. A leakage and earthing wire disconnection detection apparatus according to claim 10, wherein said power supply control means comprises:

a first logical product operating circuit for carrying out a logical product operation on the output from said leakage judgment means and the output from said earthing wire disconnection detection apparatus, and a self hold circuit with the logical product output from said first logical product operating circuit as a reset input signal, and a rising signal due to switching on a power source as a trigger input signal, which self holds the trigger input signal, and the output from said self hold circuit is said power supply permit signal.

12. A leakage and earthing wire disconnection detection apparatus according to claim 11, wherein said power supply control means comprises:

an integrating circuit for integrating said rising signal, a level detection circuit for level detecting an integration output from said integrating circuit and generating an output when the integration output becomes equal to or more than a predetermined level, and a differentiating circuit for differentiating a rising output from said level detection circuit, and the differentiation output from said differentiating circuit is the trigger input signal to said self hold circuit.

13. A leakage and earthing wire disconnection detection apparatus according to claim 11, wherein the trigger input signal to said self hold circuit is applied by switching on a manual switch.

14. A leakage and earthing wire disconnection detection apparatus according to claim 11, wherein said power supply control means comprises a power interruption protection circuit for maintaining said self hold circuit in an operable condition when the operating power source for said self hold circuit is interrupted, during a predetermined time after power source interruption.

15. A leakage and earthing wire disconnection detection apparatus according to claim 10, wherein said detection means includes a first transformer having a first primary winding connected to receive an earthing wire disconnection detection signal and a first secondary winding serially connected into said closed loop, and a second transformer having a second primary winding serially connected into said closed loop and a second secondary winding producing a judgment output signal when the two earthing wires are normal, said leakage judgment means includes at least one of said first and second transformers having a saturable magnetic core which becomes saturated when a current equal to or greater than a predetermined level flows in said closed loop.

16. A leakage and earthing wire disconnection detection apparatus according to claim 10, wherein said leakage judgment means includes a leakage detection transformer with a primary winding and a secondary winding wound on a saturable magnetic core, a pair of power supply lines to said electrical or electronic device being passed through said saturable magnetic core of said leakage detection transformer, said primary winding receiving a leakage detection signal, and said secondary winding outputting the leakage judgment output.

17. A leakage and earthing wire disconnection detection apparatus according to claim 16, wherein when a plurality of parallel-connected electrical or electronic devices are connected to the same power source via said switch means, then said leakage detection transformer is respectively provided for each of the electrical or electronic devices, the leakage detection transformers being connected in series, the primary winding of a first stage leakage detection transformer receiving the leakage detection signal, and the secondary winding of a last stage leakage detection transformer outputting the leakage judgment output, and wherein said leakage and earthing wire disconnection detection apparatus is provided for each of said respective electrical or electronic devices, and includes a second logical product operating circuit for carrying out a logical product operation on respective outputs from the respective leakage and earthing wire disconnection detection apparatus, and a logical product output from said second logical product operating circuit is said judgment output for the two earthing wires.

18. A leakage and earthing wire disconnection detection apparatus according to claim 10, wherein said switch means is an electromagnetic relay comprising an excitor coil excited by the power supply permit signal from said power supply control means, and excitation contact points connected in series to the power supply line for said electrical or electronic device, and switched on when said excitor coil is excited.

* * * * *

UNITED STATES PATENT AND TRADEMARK OFFICE
CERTIFICATE OF CORRECTION

PATENT NO.   : 5,768,077
DATED        : June 16, 1998
INVENTOR(S)  : Koichi FUTSUHARA et al.

It is certified that error appears in the above-indentified patent and that said Letters Patent is hereby corrected as shown below:

On the title page item [54], and column 1, line 5, after "FUNCTION", delete "CONDUCTOR".

Signed and Sealed this

Fourteenth Day of September, 1999

Attest:

Q. TODD DICKINSON

*Attesting Officer*   *Acting Commissioner of Patents and Trademarks*